(12) United States Patent
Lee (10) Patent No.: US 9,581,988 B2
(45) Date of Patent: Feb. 28, 2017

(54) METHOD AND SYSTEM FOR BATTERY STATE OF CHARGE ESTIMATION

(71) Applicant: Ford Global Technologies, LLC, Dearborn, MI (US)

(72) Inventor: Tae-Kyung Lee, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 151 days.

(21) Appl. No.: 14/296,646

(22) Filed: Jun. 5, 2014

(65) Prior Publication Data

US 2015/0355615 A1    Dec. 10, 2015

(51) Int. Cl.
| | | |
|---|---|---|
| G05B 17/02 | (2006.01) | |
| G06F 17/10 | (2006.01) | |
| G06F 17/50 | (2006.01) | |
| G01R 31/00 | (2006.01) | |
| B60L 11/18 | (2006.01) | |
| G01R 31/36 | (2006.01) | |

(52) U.S. Cl.
CPC .......... *G05B 17/02* (2013.01); *B60L 11/1805* (2013.01); *B60L 11/1861* (2013.01); *B60L 11/1864* (2013.01); *G01R 31/007* (2013.01); *G06F 17/10* (2013.01); *G06F 17/5009* (2013.01); *B60L 2240/545* (2013.01); *B60L 2240/547* (2013.01); *B60L 2240/549* (2013.01); *B60L 2260/44* (2013.01); *G01R 31/3651* (2013.01); *Y02T 10/7005* (2013.01); *Y02T 10/7011* (2013.01); *Y02T 10/7044* (2013.01); *Y02T 10/7061* (2013.01)

(58) Field of Classification Search
None
See application file for complete search history.

(56) References Cited

U.S. PATENT DOCUMENTS

| | | | |
|---|---|---|---|
| 8,103,485 B2 | 1/2012 | Plett | |
| 2011/0060565 A1 | 3/2011 | Sciarretta et al. | |
| 2012/0109443 A1* | 5/2012 | Takahashi | B60L 1/003 701/22 |
| 2012/0130692 A1 | 5/2012 | Li et al. | |
| 2013/0119921 A1 | 5/2013 | Choe et al. | |
| 2015/0112619 A1* | 4/2015 | Takahashi | H01M 10/48 702/63 |
| 2015/0355283 A1* | 12/2015 | Lee | G01R 31/3648 702/63 |

FOREIGN PATENT DOCUMENTS

WO    WO2013/153709    * 10/2013

* cited by examiner

*Primary Examiner* — Patrick Ryan
*Assistant Examiner* — Wyatt McConnell
(74) *Attorney, Agent, or Firm* — David B. Kelley; Brooks Kushman P.C.

(57) ABSTRACT

A powertrain having a Lithium-ion (Li-ion) traction battery including solid active particles is operated according to a state of charge of the battery based on an estimated Li-ion concentration profile of a representative solid active particle of a reduced-order model of the battery. The concentration profile is estimated according to the reduced-order model from the measured voltage and current of the battery.

10 Claims, 5 Drawing Sheets

FIG. 3A Even Discretization

FIG. 3B Uneven Discretization

METHOD AND SYSTEM FOR BATTERY STATE OF CHARGE ESTIMATION

TECHNICAL FIELD

The present invention relates to estimating the state of charge (SOC) of a battery.

BACKGROUND

An electric vehicle includes a traction battery. The battery has a state of charge (SOC) indicative of the current charging state of the battery. Knowledge of the battery SOC enables usable battery energy and battery power capability to be calculated.

The SOC of a battery may be estimated indirectly. One approach to estimating the battery SOC involves battery current integration (i.e., coulomb counting). A problem with such battery current integration approaches is that highly accurate current sensors are required to ensure the accuracy of the SOC estimation. Another approach uses battery voltage information to estimate the SOC. A problem with such battery voltage translation approaches is that many of them are either map-based or simplified equivalent circuit model based.

A battery is operated around a given battery SOC setpoint in charge sustaining driving mode. The battery SOC estimation provided by the noted existing estimation approaches may be valid in this case as the long time duration dynamics are negligible. However, slow diffusion dynamics are dominant in charge depleting driving mode. The battery SOC estimation provided by the noted existing estimation approaches will not be valid due to the high non-linearity of the slow dynamics and dynamic components along wide frequency ranges.

Another battery SOC estimation approach should be developed which can be used over wide SOC, temperature ranges, and various vehicle driving conditions.

SUMMARY

In embodiments, a powertrain having a Lithium-ion (Li-ion) traction battery pack is operated according to values of performance variables of the battery. The performance variables include a state of charge (SOC) of the battery and available battery power limits. The performance variables are estimated from the state variables, represented by Li-ion concentrations in a reduced-order electrochemical battery model. The battery model is further reduced using uneven discretization of the derived ordinary differential equation of the model. A method to estimate the battery SOC based on the estimated Li-ion concentration profile representing electrochemical dynamics of the positive and negative electrodes in the battery cell is provided. The concentration profile is estimated from the measured voltage and current of the battery using Extended Kalman Filter (EKF). The EKF is constructed based on the reduced-order battery model.

In embodiments, a Lithium-ion (Li-ion) traction battery including solid active particles is operated according to a SOC of the battery based on an estimated Li-ion concentration profile representing electrochemical dynamics of a battery cell or pack. Electrochemical dynamics are modeled using a diffusion equation, which captures the electrochemical dynamics of both electrodes, i.e., a positive electrode and a negative electrode. The reduced-order model adopts the structure of an electrode averaged model, but the model validity is extended to wider ranges of operating conditions by adding medium-to-slow dynamics information to the state variables, which are represented by effective Li-ion concentration profiles. The effective Li-ion concentration profile is estimated according to the model from the measured voltage and current of the battery.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
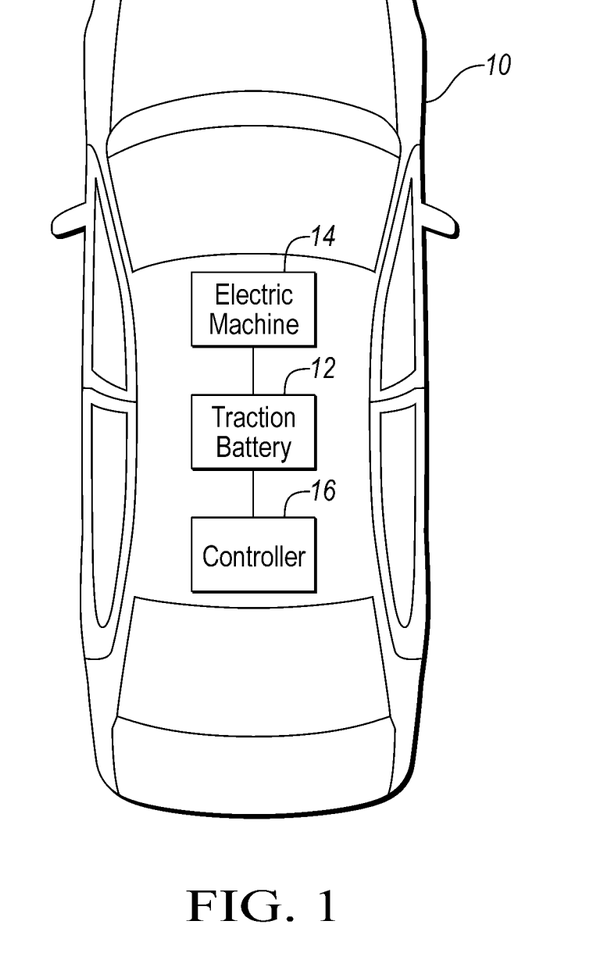
FIG. 1 illustrates a block diagram of a power storage system of an electric vehicle in accordance with embodiments of the present invention.

Referring now to FIG. 1, a block diagram of a power storage system of an electric vehicle 10 such as a hybrid electric vehicle in accordance with embodiments of the present invention is shown. The power storage system includes a traction battery 12. Battery 12 is configured to provide electrical power to an electric machine 14 such as a motor/generator that converts the electrical power to motive power for propelling vehicle 10. Battery 12 includes any number and/or type of energy storage cells. For instance, battery 12 is a Lithium-Ion (Li-ion) battery having a plurality of Li-ion power storage cells.

A controller 16 is configured to monitor parameters associated with battery 12 and control the operation of the battery based on the parameters and other factors. Controller 16 is further configured to estimate the state of charge (SOC) of battery 12 pursuant to a battery SOC estimation process in accordance with embodiments of the present invention. The SOC estimation process includes estimating the SOC of battery 12 from the (measured) battery voltage in real time using a reduced-order electrochemistry model of the battery.

Objectives of the battery SOC estimation process include: 1) generating a reduced-order electrochemical battery model (i.e., an electrode-averaged battery model) which can capture the dynamics of battery 12 with sufficient accuracy; 2) minimizing the number of parameters for tuning the reduced-order battery model; and 3) estimating battery SOC from the measured battery voltage in real-time using the reduced-order battery model.

The derivation of the reduced-order or electrode-averaged model of battery 12 ("reduced-order battery model") is based on the understanding of the full-order electrochemical model of battery 12. This full-order battery model is manipulated to the reduced-order model with the assumption that each electrode (i.e., cathode and anode) can be represented by the averaged electrode particle. This reduced model is then further reduced with the assumption that the diffusion dynamics can be represented by a representative diffusion dynamics accounting for the combined dynamics of the cathode and anode. This makes the resulting model size to be one-half of a model with two single particles. The resulting diffusion dynamics are the averaged diffusion dynamics of the cathode and the anode.

Separately, instantaneous voltage drops by the electrolyte and the over-potential, which is computed from the Butler-Volmer current density equation, are combined in a single internal resistance term. These assumptions make the reduced-order or electrode-averaged battery model even simpler as open potential and electrolyte potential terms do not need to be computed separately.

In turn, Li-ion concentration profiles, which represent the battery cell dynamics, are estimated from input current profiles of output voltage measurement profiles using Extended Kalman Filter (EKF) based on the reduced-order battery model. The battery SOC is then computed from the estimated Li-ion concentration profiles.

Figure 2:
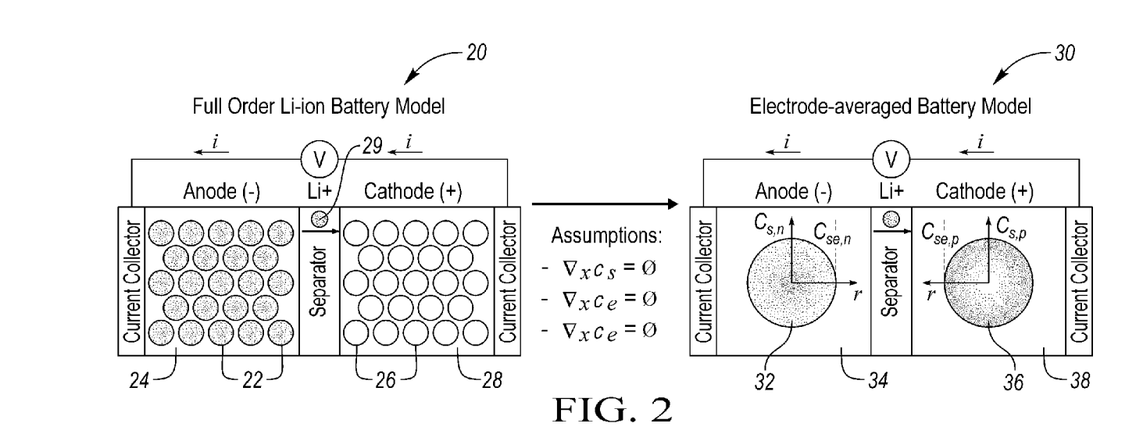
FIG. 2 illustrates a representation of a full-order electrochemical battery model and a reduced-order electrochemical battery model (i.e., an electrode-averaged battery model) derived from the full-order battery model pursuant to a battery state of charge (SOC) estimation process in accordance with embodiments of the present invention.

Referring now to FIG. 2, an illustration of the full-order electrochemical battery model 20 and an illustration of the reduced-order electrochemical battery model 30 derived from full-order battery model 20 are shown. Again, reduced-order battery model 30 is derived from full-order battery model 20 as part of a battery SOC estimation process in accordance with embodiments of the present invention. Then, reduced-order battery model 30 is further simplified to estimate battery electrochemical states represented by Li-ion concentration profiles and to estimate the battery SOC. Although the simplification of reduced-order battery model 30 may lose prediction accuracy under high charging and discharging conditions, important diffusion dynamics in the solid particle are described in reduced-order battery model 30.

Again, with reference to FIG. 2, dynamics of the positive and negative electrodes may be represented by the combined dynamics of each electrode. As shown in FIG. 2, full-order battery model 20 includes a plurality of active material, solid particles 22 immersed within an electrolyte solution 24 in the anode and a plurality of active material, solid particles 26 immersed within an electrolyte solution 28 in the cathode. As known to one of ordinary skill, a Li-ion 29 (only one shown for simplicity) moves along a path from solid particles 22 of the anode to a path of solid particles 26 of the cathode to thereby generate electric current I upon an application of a voltage V across the battery.

As further shown in FIG. 2, reduced-order battery model 30 is simplified relative to full-order battery model 20 by including an averaged solid particle 32 immersed in an electrolyte solution 34 in the anode and an averaged solid particle 36 immersed in an electrolyte solution 38 in the cathode. Averaged solid particle 32 is representative of the plurality of solid particles 22 in the anode of full-order battery model 20 and averaged solid particle 36 is representative of the plurality of solid particles 26 in the cathode of full-order battery model 20.

The derivation of reduced-order battery model 30 from full-order battery model 20 will now be described in detail. As known to one of ordinary skill, full-order battery model 20 is represented by the following equations:

$$\vec{\nabla}_k X^{eff} \vec{\nabla}_x \phi_e + \vec{\nabla}_x K_D^{eff} \vec{\nabla}_x \ln c_e = -j^{Li}$$

$$\vec{\nabla}_x \sigma^{eff} \vec{\nabla}_x \phi_s = j^{Li}$$

$$\frac{\partial \varepsilon_e c_e}{\partial t} = \vec{\nabla}_x \left( D_e^{eff} \vec{\nabla}_x c_e \right) + \frac{1 - t^0}{F} j^{Li}$$

$$\frac{\partial c_s}{\partial t} = \vec{\nabla}_r (D_s \vec{\nabla}_r c_s)$$

where $\phi$ is the electric potential, c is the Li-ion concentration, subscript s and e represent the active electrode solid particle and the electrolyte respectively, $\sigma^{eff}$ is the effective electrical conductivity of the electrode, $\kappa^{eff}$ is the effective electrical conductivity of the electrolyte, $\kappa_D^{eff}$ is the liquid junction potential term, $D_s$ is the diffusion coefficient of Li-ion in the electrode, $D_e^{eff}$ is the effective diffusion coefficient of Li-ion in the electrolyte, $t^0$ is the transference number, and F is the Faraday constant.

The Butler-Volmer current density equation is as follows:

$$j^{Li} = a_s j_0 \left[ \exp\left(\frac{\alpha_a F}{RT} \eta\right) - \exp\left(-\frac{\alpha_c F}{RT} \eta\right) \right]$$

where, $\alpha_a$ is the transfer coefficient for anodic reaction, $\alpha_c$ is the transfer coefficient for cathodic reaction, R is the gas constant, T is the temperature, $\eta = \phi_s - \phi_e - U(c_{se})$ is the over potential at the solid-electrolyte interface at an active solid particle, and $j_0 = k(c_e)^{\alpha_a}(c_{s,max} - c_{se})^{\alpha_a}(c_{se})^{\alpha_c}$.

The battery terminal voltage V is according to the following equation:

$$V = \phi_s(x = L) - \phi_s(x = 0) - \frac{R_f}{A} I$$

Reduced-order battery model 30 is derived from full-order battery model 20 by making the following assumptions as shown in FIG. 2:

$\nabla_x \mathcal{O}_s$ is 0 (the gradient of the electric potential in the solid with respect to the direction from the anode to the cathode (i.e., the x-direction) is zero);

$\nabla_x \mathcal{O}_e$ is 0 (the gradient of the electric potential in the electrolyte with respect to the x-direction is zero); and $\nabla_x c_e$ is 0 (the gradient of the Li-ion concentration in the electrolyte ($c_e$) with respect to the x-direction is zero).

As a result of these assumptions, reduced-order battery model 30 is represented by the following ordinary differential equation (ODE) of each electrode (1):

$$\frac{\partial c_s}{\partial t} = \vec{\nabla}_r(D_s \vec{\nabla}_r c_s) \quad (1)$$

The derived ODE represents the electrochemical dynamics of each electrode.

With the assumption that the electrochemical dynamics of the positive and negative electrodes can be combined and then represented by one ODE, an effective Li-ion concentration profile representing electrochemical dynamics combining both electrodes is estimated by the ODE. In other words, the Li-ion concentration profile for each of averaged solid particles 32 and 36 is considered to be the same for simplification.

The battery terminal voltage is according to the following equation (2):

$$V = U(c_{se}) - R_0 i \quad (2)$$

where $C_{se}$ is the effective Li-ion concentration at the solid-electrolyte interface and $R_0$ is the internal resistance term which depends on the open circuit voltage and is a known quantity of battery 12.

The ODE (1) describes the Li-ion diffusion dynamics and other medium-to-slow electrochemical dynamics of battery 12. The states of the equation (1) are Li-ion concentrations along the discretized particle radius and are given by the following matrix equation (3):

$$c_s = [c_{s,1} \ldots c_{s,Mr-1}]^T \quad (3)$$

The control input is battery input current represented by the following equation (4):

$$u_k = i_k \quad (4)$$

The (measured) system output (y) is the battery terminal voltage and the battery terminal voltage expression is represented by the following equation (5):

$$y = U(c_{se}) - R_0 i \quad (5)$$

Equation (5) for the measured battery terminal voltage corresponds to the proposed terminal voltage equation (2) ($V = U(c_{se}) - R_0 i$).

As described herein, only one ordinary differential equation (i.e., the state-space equation (1)) is solved for both of the anode and the cathode. Thus, the diffusion dynamics from equation (1) represent the averaged sense of the diffusion dynamics of both the anode and the cathode. The battery terminal voltage is reduced to the terminal voltage equation (2) with the assumption that the over-potential and voltage drops by electrolyte can be represented by the internal resistance $R_0$. This assumption enables to exclude over-potential calculations associated with full-order battery model 20 and thus the resulting reduced-order battery model 30 is even simpler.

Again, the state vector according to the matrix equation (3) ($c_s = [c_{s,1} \ldots c_{s,Mr-1}]^T$) represents the Li-ion concentration profiles along the electrode solid particle radius. The averaged Li-ion concentration profile is calculated according to the following equation (other expressions can also be used):

$$\bar{c}_s = \frac{c_{s,1} r_1^3 + \sum_{i=1}^{Mr-1} \frac{3}{8}(c_{s,i} + c_{s,i+1})(r_i + r_{i+1})^2 (r_i - r_{i+1})}{r_{Mr-1}^3}$$

The SOC of battery 12 may then be estimated according to the following equation:

$$S\hat{O}C = \frac{\bar{\theta}_s - \theta_{0\%}}{\theta_{100\%} - \theta_{0\%}}$$

where $$\bar{\theta}_s = \frac{\bar{c}_s}{c_{s,max}}$$

with $\theta_{0\%}$ at 0% SOC; with $\theta_{100\%}$ at 100% SOC; and $c_{s,max}$ being maximum Li-ion concentration.

Figure 3A:
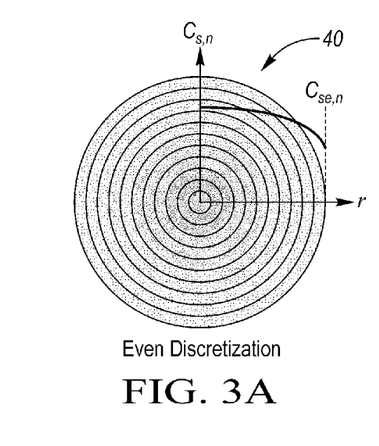
FIG. 3A illustrates a representation of an even discretization of the Li-ion concentration profile along the electrode solid particle radius for the reduced-order battery model.
Figure 3B:
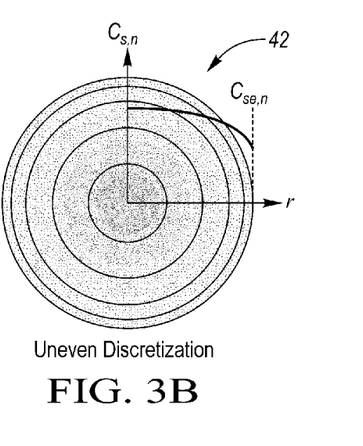
FIG. 3B illustrates a representation of an uneven discretization of the Li-ion concentration profile along the electrode solid particle radius for the reduced-order battery model.

Referring now to FIGS. 3A and 3B, with continual reference to FIG. 2, representations of an even discretization 40 and an uneven discretization 42 of the Li-ion concentration profile along the electrode solid particle radius for reduced-order battery model 30 are respectively shown. Objectives of uneven discretization 42 include obtaining the same level of prediction accuracy with a reduced order model while maintaining Li-ion concentration profile observability.

For uneven discretization 42, the state-space, ordinary differential equation (1), which describes the Li-ion concentration diffusion dynamics in the averaged solid particle, converts to the following matrix equation (6):

$$\dot{c}_s = A c_s + B i \quad (6)$$

where $$A = \begin{bmatrix} -\frac{2D_{s,k}}{r_1^2} & \frac{2D_s}{r_1^2} & \cdots & & 0 & 0 \\ 0 & \ddots & & & & 0 \\ \vdots & \alpha_j\left(\frac{1}{\Delta r_{j-1}} - \frac{1}{r_j}\right) & -\alpha_j\left(\frac{1}{\Delta r_j} + \frac{1}{\Delta r_{j-1}}\right) & \alpha\left(\frac{1}{\Delta r_j} + \frac{1}{r_j}\right) & & \vdots \\ 0 & & & \ddots & & 0 \\ 0 & 0 & \cdots & & \alpha_{Mr-1}\left(\frac{1}{\Delta r_{Mr-2}} - \frac{1}{r_{Mr-1}}\right) & -\alpha_{Mr-1}\left(\frac{1}{\Delta r_{Mr-2}} - \frac{1}{r_{Mr-1}}\right) \end{bmatrix}$$

$$B = \begin{bmatrix} 0 & \cdots & 0 & -\alpha_{Mr-1}\left(1 + \frac{\Delta r_{Mr-1}}{r_{Mr-1}}\right)\frac{1}{Fa_sD_s} \end{bmatrix}^T$$

The state-space matrix equation (6) ($\dot{c}_s = Ac_s + Bi$) is the continuous expression for the state-space equation around the equilibrium.

The discretized expression for the state-space equation around the equilibrium is represented by the following equation (7):

$$c_{k+1} = A_k c_k + B_k i_k \quad (7)$$

where
$A_k = (I + A\Delta t)$
$B_k = B\Delta t$

The battery terminal voltage equation is then given by the following equation (8):

$$y_k = H_k c_s - R_0 i_k \quad (8)$$

where $$H_k = \frac{\partial y_k}{\partial c_s} = \begin{bmatrix} 0 & \cdots & 0 & \left.\frac{\partial U(c_{se})}{\partial c_{se}}\right|_k \end{bmatrix}$$

and where, with the assumption that $c_{se} = c_{Mr-1}$ $$\left.\frac{\partial U(c_{se})}{\partial c_{se}}\right|_k = \frac{\partial U(SOC_{se})}{\partial SOC_{se}} \frac{\partial SOC_{se}}{\partial c_{se}} = \frac{1}{c_{max}(\theta_{100\%} - \theta_{0\%})} \frac{dU(SOC_{se})}{dSOC_{se}}$$

In the output matrix $H_k$, a pre-calculated $$\frac{dU(SOC_{se})}{dSOC_{se}}$$

profile with respect to the estimated Li-ion concentration at the solid-electrolyte interface is used.

Figure 4:
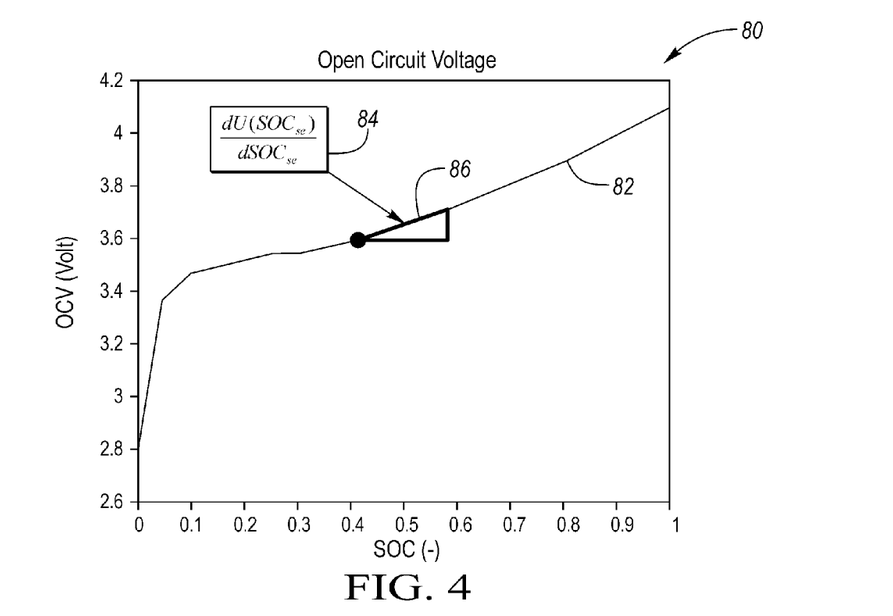
FIG. 4 illustrates a graph of open circuit voltage of the battery versus battery SOC.

FIG. 4 illustrates a graph 80 including a plot line 82 of open circuit voltage of battery 12 versus the battery SOC. As shown in graph 80, the pre-calculated $$\frac{dU(SOC_{se})}{dSOC_{se}}$$

profile 84 corresponds to the slope 86 of plot line 82 at any given point along plot line 82.

From $A_k$ and $H_k$ (or from A and H) battery 12 is fully observable. (Note that the symbol A or $A_k$ may be replaced herein with the symbol F or $F_k$.)

The model based Extended Kalman Filter (EKF) design follows the following series of equations.
Predict:

$$\hat{x}_{k|k-1} = f(\hat{x}_{k-1|k-1}, u_{k-1})$$

$$P_{k|k-1} = F_{k-1} P_{k-1|k-1} F_{k-1}^T + Q_k$$

Update:

$$\tilde{y}_k = y_k - h(\hat{x}_{k|k-1})$$

$$S_k = H_k P_{k|k-1} H_k^T + R_k$$

$$K_k = P_{k|k-1} H_k^T S_k^{-1}$$

$$\hat{x}_{k|k} = \hat{x}_{k|k-1} + K_k \tilde{y}_k$$

$$P_{k|k} = (I - K_k H_k) P_{k|k-1}$$

where:

$$F_{k-1} = \left.\frac{\partial f}{\partial x}\right|_{\hat{x}_{k-1|k-1}, u_{k-1}}$$

$$H_k = \left.\frac{\partial h}{\partial x}\right|_{\hat{x}_{k|k-1}}$$

$$P_{k|k} = \text{cov}(x_k - \hat{x}_{k|k}) = E\big((x_k - \hat{x}_{k|k})(x_k - \hat{x}_{k|k})^T\big)$$

$$P_{k|k-1} = \text{cov}(x_k - \hat{x}_{k|k-1}) = E\big((x_k - \hat{x}_{k|k-1})(x_k - \hat{x}_{k|k-1})^T\big)$$

$$S_k = \text{cov}(y_k - \hat{y}_k) = E\big((y_k - \hat{y}_k)(y_k - \hat{y}_k)^T\big)$$

$$Q_k = \text{cov}(\omega_k) = E(\omega_k \omega_k^T)$$

$$R_k = \text{cov}(v_k) = E(v_k v_k^T)$$

The overall SOC estimation of battery 12 is summarized as follows.

Using the constructed state-space models and EKF, the Li-ion concentration profiles of battery 12 are estimated using according to the following equations:

$$c_{k+1} = F_k c_k + B_k i_k$$

$$y_k = H_k c_s - R_0 i_k$$

The estimated Li-ion concentration profiles being represented by the following equation:

$$\hat{c}_{k+1} = \hat{c}_k + K_k(y_k - \hat{y}_k)$$

The SOC of battery 12 is then estimated from the Li-ion concentration profile information according to the following equation:

$$S\hat{O}C = \frac{\bar{\theta}_s - \theta_{0\%}}{\theta_{100\%} - \theta_{0\%}}$$

where $$\bar{\theta}_s = \frac{\bar{c}_s}{c_{s,max}}$$

$$\bar{c}_s = \frac{c_{s,1} r_1^3 + \sum_{i=1}^{Mr-1} \frac{3}{8}(c_{s,i} + c_{s,i+1})(r_i + r_{i+1})^2(r_i - r_{i+1})}{r_{Mr-1}^3}$$

Figure 5:
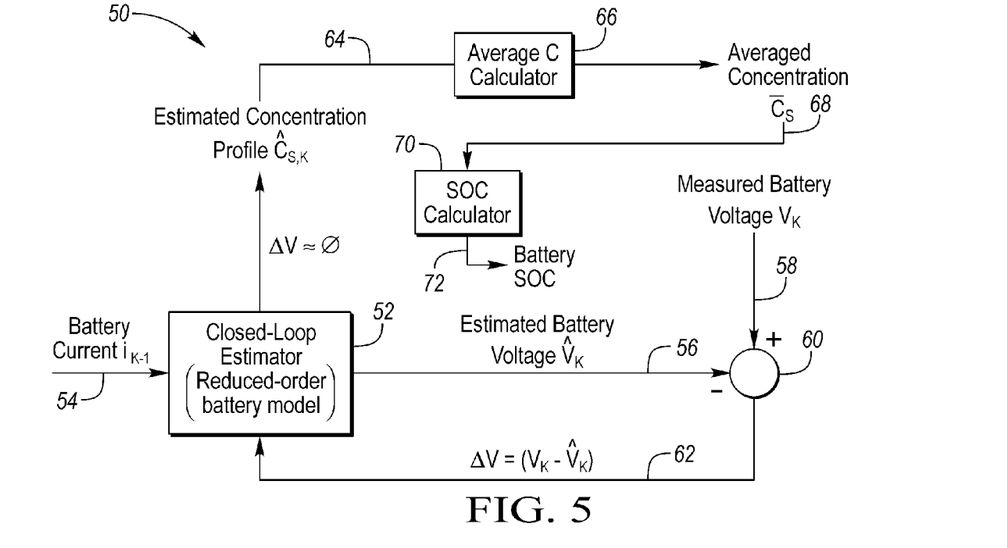
FIG. 5 illustrates a block diagram illustrating operation of a method and a system for estimating the SOC of a battery using the reduced-order battery model in accordance with embodiments of the present invention.

Referring now to FIG. 5, a block diagram 50 illustrating the operation of estimating the battery SOC using reduced-order battery model 30 in accordance with embodiments of the present invention is shown. Again, controller 16 is configured to implement the operation for estimating the battery SOC using reduced-order battery model 30. The operation employs a closed-loop estimator 52 according to reduced-order battery model 30. The design of estimator 52 pursuant to the Extended Kalman Filter (EKF) techniques described herein is characterized by the diffusion dynamics equation $c_{k+1}=F_k c_k+B_k i_k$ and the measured battery voltage equation $y_k=H_k c_s-R_0 i_k$. As indicated above, the control input to estimator 52 is the current $i_{k-1}$ 54 of battery 12. Estimator 52 generates an estimated battery voltage $v_k$ 56 based on the battery current $i_{k-1}$ 54. The actual battery voltage $v_k$ 58 is measured. The estimated and measured battery voltages 56 and 58 are input to a comparator 60. Comparator 60 generates a difference $\Delta v$ 62 indicative of the voltage difference between the estimated and measured battery voltages 56 and 58. The voltage difference $\Delta v$ 62 is input back to estimator 52, which in turn generates another battery voltage estimate 56. This process repeats to cause the voltage difference $\Delta v$ 62 to be close to zero. As a result the voltage difference $\Delta v$ 62 being close to zero, estimator 52 is able to generate a relatively accurate estimated (Li-ion) concentration profile $c_{s,k}$ 64. The estimated concentration profile 64 is averaged by a calculator 66 as described herein to produce averaged concentration $c_s$ 68. A battery SOC calculator 70 estimates the battery SOC 72 based on the averaged concentration 68 as described herein.

A method and system for estimating the SOC of a battery from the measured battery voltage using a reduced-order battery model in accordance with embodiments of the present invention includes the following features. The electrochemical process of the battery is captured by reduced-order battery model 30. This means that once model 30 is calibrated, it can be used over a wide range of operating points, SOC, and temperature. The proposed reduced-order battery model 30 is much simpler than typical electrochemical battery models such as full-order battery model 20. This is possible by introducing several assumptions as described herein. Battery model 30 can be tuned by a relative small number of model parameters. The Extended Kalman Filter (EKF) is used for the SOC estimation and its formulation is simple enough to be implemented in the battery management system (BMS) of controller 16.

The method and system for estimating the SOC of a battery in accordance with embodiments of the present invention include other features. The method and system provide an alternative way to estimate the battery SOC with sufficient accuracy only using battery current input and the terminal voltage output information in real time. Reduced-order battery model 30 is relatively simple enough to be used for control design. The model calibration is much easier than the case of equivalent circuit battery model when the prediction accuracy is same. The SOC estimation accuracy is much less sensitive to the current sensor due to the inherent noise rejection capability of the EKF.

Figure 6A:
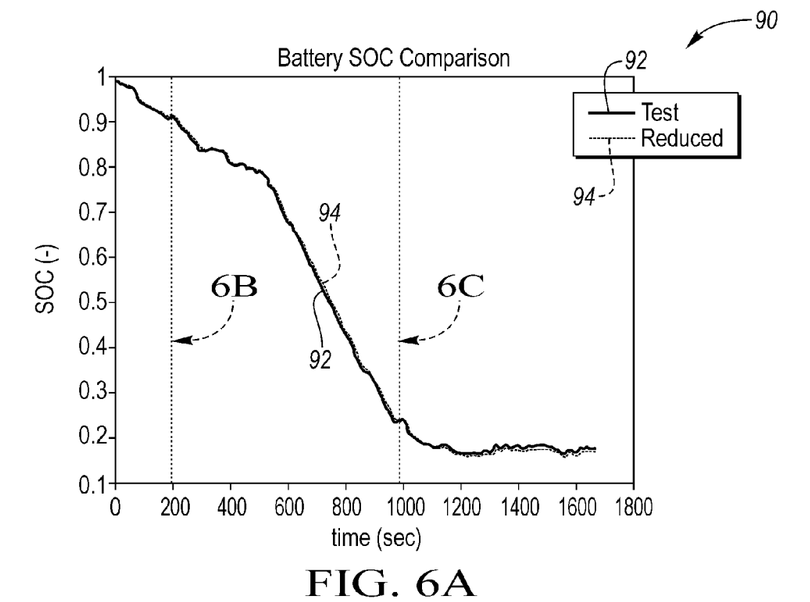
FIG. 6A illustrates a graph depicting the battery SOC over time including a comparison between the actual battery SOC and the battery SOC calculated using the reduced-order battery model in accordance with embodiments of the present invention.

Referring now to FIG. 6A, a graph 90 depicting versus time the actual battery SOC and the battery SOC calculated using the reduced-order battery model in accordance with embodiments of the present invention is shown. Graph 90 includes a plot line 92 of the actual battery SOC. Graph 90 further includes a plot line 94 of the battery SOC calculated as described herein using the reduced-order battery model. As shown in graph 90, plot lines 92 and 94 essentially lie on top of one another thereby illustrating that the calculated battery SOC is highly accurate to the actual battery SOC.

Figure 6B:
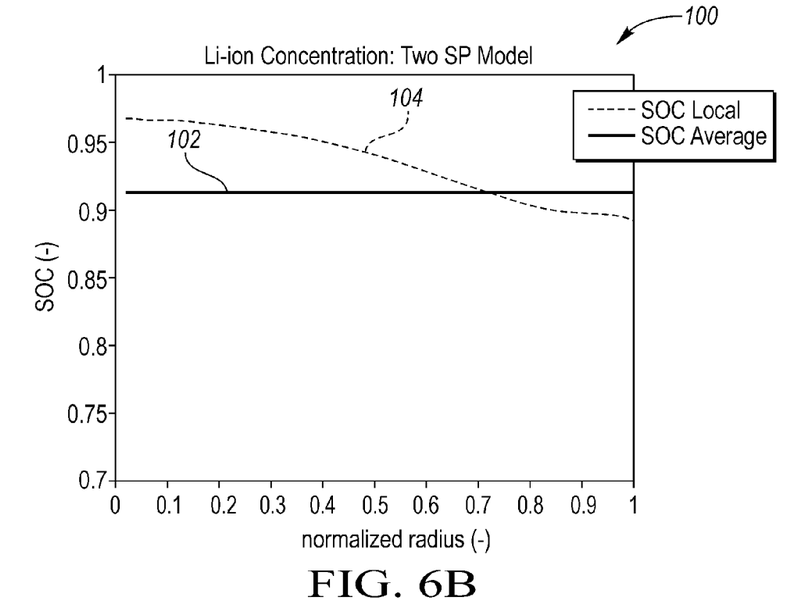
FIG. 6B illustrates a graph depicting the concentration profile versus normalized electrode solid particle radius at a time instant including a comparison of the average concentration and the concentration estimated in accordance with embodiments of the present invention.

FIG. 6B illustrates a graph 100 depicting the Li-ion concentration profile versus the normalized electrode solid particle radius at a certain time instant (namely, with reference to FIG. 6A, 200 seconds at which the battery SOC is about 0.9). Graph 100 includes a plot line 102 of the average concentration. Graph 100 further includes a plot line 104 of the concentration estimated as described herein. As such, graph 100 illustrates a comparison of the average concentration and the concentration estimated in accordance with embodiments of the present invention at a given time instant associated with a given battery SOC value.

Figure 6C:
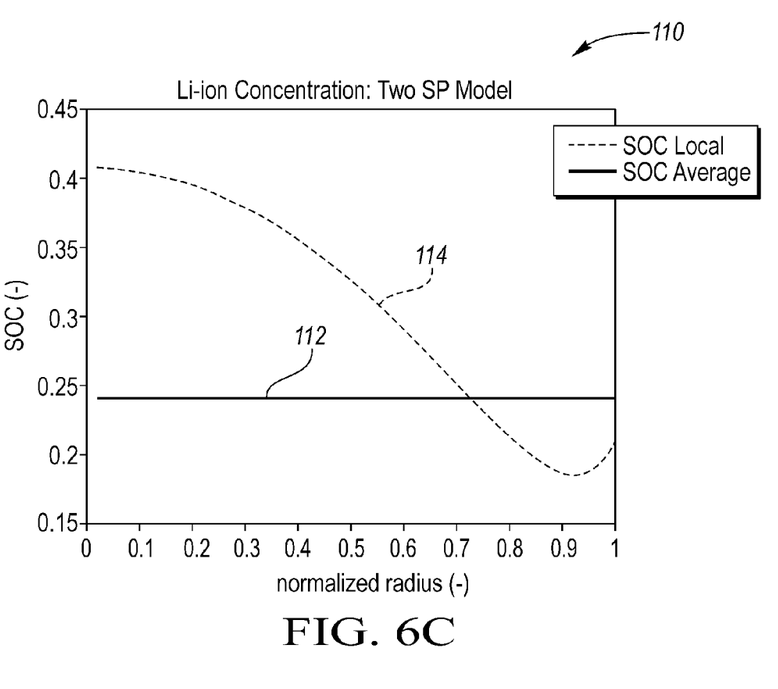
FIG. 6C illustrates a graph depicting the concentration profile versus normalized electrode solid particle radius at another time instant including a comparison of the average concentration and the concentration estimated in accordance with embodiments of the present invention.

FIG. 6C illustrates a graph 110 depicting the Li-ion concentration profile versus the normalized electrode solid particle radius at a certain time instant (namely, with reference to FIG. 6A, 1000 seconds at which the battery SOC is about 0.2). Graph 110 includes plot line 112 of the average concentration and plot line 114 of the estimated concentration estimated. As such, graph 110 illustrates a comparison of the average concentration and the concentration estimated in accordance with embodiments of the present invention at another time instant associated with another battery SOC value.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A method for a powertrain having a Lithium-ion (Li-ion) traction battery, including solid active particles, and a traction motor, the method comprising:
   providing electric power from the traction battery to the traction motor for propelling a vehicle; and
   operating, by a controller in communication with the traction battery, the traction battery in providing electric power to the traction motor according to a state of charge of the battery based on an estimated Li-ion concentration profile of a representative solid active particle of a reduced-order model of the battery, the concentration profile being estimated according to the model from measured voltage and current of the battery.

2. The method of claim 1 wherein:
   the reduced-order model employs an ordinary differential equation representing combined electrochemical dynamics of a positive electrode and a negative electrode of a battery cell of the battery.

3. The method of claim 2 further comprising:
   deriving the reduced-order model from a full-order electrochemical model of the battery using uneven discretization of the ordinary differential equation.

4. The method of claim 1 further comprising:
   computing the state of charge of the battery from the estimated concentration profile.

5. The method of claim 1 further comprising:
   outputting a battery terminal voltage using the reduced-order model.

6. The method of claim 1 further comprising:
   estimating the concentration profile using the reduced-order model.

7. The method of claim 5 further comprising:
   estimating the concentration profile according to the reduced-order model from the measured voltage and current of the battery using Extended Kalman Filter (EKF) techniques.

8. A vehicle comprising:
   a traction motor;
   a Lithium-ion (Li-ion) traction battery including solid active particles; and
   a controller to operate the battery to provide electricity to the motor according to a state of charge of the battery based on an estimated Li-ion concentration profile of a representative solid active particle of a reduced-order model of the battery and to estimate the concentration profile according to the model from measured voltage and current of the battery.

9. The vehicle of claim 8 wherein:
the controller is further configured to estimate the concentration profile using an Extended Kalman Filter (EKF).

10. The vehicle of claim 8 wherein:
the controller is further configured to output battery terminal voltage estimated according to the reduced-order model.

* * * * *